United States Patent [19]
deKlerk

[11] 3,846,722

[45] Nov. 5, 1974

[54] SURFACE WAVE PRESELECTOR

[75] Inventor: John deKlerk, Pittsburgh, Pa.

[73] Assignee: Westinghouse Electric Corporation, Pittsburgh, Pa.

[22] Filed: Apr. 4, 1973

[21] Appl. No.: 347,979

[52] U.S. Cl. ...................... 333/72, 310/8.1, 310/9.8, 333/30 R

[51] Int. Cl. ........ H03h 9/26, H03h 9/32, H01v 7/00

[58] Field of Search ............ 333/72, 30; 310/8, 8.1, 310/8.2, 9.7, 9.8

[56] References Cited

UNITED STATES PATENTS

| | | | |
|---|---|---|---|
| 3,582,540 | 6/1971 | Adler et al. | 333/72 X |
| 3,621,482 | 11/1971 | Adler | 333/72 |
| 3,626,309 | 12/1971 | Knowles | 333/72 X |
| 3,723,916 | 3/1973 | Speiser | 333/30 |
| 3,766,496 | 10/1973 | Whitehouse | 333/72 X |

OTHER PUBLICATIONS

Mitchell et al.–"Surface Wave Filters" in Mullard Technical Communications, No. 8, Nov. 1970, Vol. 11; pp. 179–181.

Fisk–"Surface Wave Devices" in Popular Electronics, March 1971; pp. 29–33.

*Primary Examiner*—James W. Lawrence
*Assistant Examiner*—Marvin Nussbaum
*Attorney, Agent, or Firm*—D. Schron

[57] ABSTRACT

A surface wave preselector having a piezoelectric base member upon which is mounted at least one interdigital transmitter grid. The transmitter grid includes a plurality of interdigitated electrodes adapted to receive an electrical input signal and generate a surface wave in the base in response to a selected frequency of the input signal. At least one interdigital receiver grid positioned on the base opposite a transmitter grid and adapted to receive a transmitted surface wave of selected frequency and produce an output signal in response thereto.

4 Claims, 4 Drawing Figures

SURFACE WAVE PRESELECTOR

FIELD OF THE INVENTION

The present invention relates to a surface wave preselector.

BACKGROUND OF THE INVENTION

While known for over a century, elastic surface waves have found practical utility only within the last few years. Of known surface waves, the Rayleigh wave has been the subject of most investigations and has achieved the widest application. The Rayleigh surface wave has a particle displacement which is retrograde elliptical and has both shear and compressional components. One of the most effective methods of generating a Rayleigh wave in a crystalline medium, such as quartz or lithium niobate, is with an electrode structure on the surface of the crystal for electromechanically coupling with the piezoelectric matrix of the crystal. At certain frequencies, phase coherence exists between the acoustic waves generated by individual electrode transducers on the surface. Under such conditions a Rayleigh wave will be generated on the surface and propagate along the surface axis.

In bulk single crystal piezoelectric materials, such as lithium niobate, silicon dioxide, cadmium sulfide and zinc oxide, delay lines and amplifiers have been fabricated with frequencies up to 100 MHz. Surface wave generation, propagation and detection in piezoelectric films, such as cadmium sulfide, zinc oxide, and zinc sulfide, on passive substrates such as $Al_2O_3$ and silicon have also been achieved. These thin films are capable of being utilized in both dispersive and nondispersive devices between 100 and 400 MHz, depending upon the ratio of the film thickness to the surface wave length.

Surface wave transducers have been successfully utilized in signal processing including radar. An efficient method of generating surface waves is the use of an interdigital grid on a piezoelectric material. 9 *Ultrasonics*, p. 35 (1971). Each pair of electrodes of an interdigital grid generates half a Rayleigh wavelength. The grid becomes resonant at the frequency for which the spacing between the centers of adjacent electrodes is half an elastic surface wavelength. When the frequency of the applied alternating voltage is such that the surface acoustic wave coincides with the distance between the centers of two adjacent electrodes of one of the pairs of grids, an elastic wave is generated on the surface in typically both directions normal to the electrode. A condition which must be satisfied for the generation of a piezoelectrically coupled Rayleigh wave is that the crystal axis must be chosen so that two orthogonal electric field components $E_i$ under the grid couple to piezoelectric moduli $d_{ij}$ which generates the relevant shear and compressional strain components.

It is thus an object of the present invention to provide an acoustic surface wave preselector utilizing a plurality of interdigital grids. It is a further object of the present invention to provide a surface wave preselector which is capable of use in integrated circuits for signal processing applications such as in radio communication devices, television tuners, multiplexers, and the like.

SUMMARY OF THE INVENTION

Generally, the surface wave preselector of the present invention comprises a base member capable of propagating a surface wave. Preferably, the base comprises a piezoelectric material such as $LiNbO_3$, $Bi_{12}GeO_{20}$, $SiO_2$, GaAs, ZnO, ZnS, CdS and the like formed as a thin-film on a passive substrate.

A first array of interdigital transmitter grids is deposited on the surface of the base member. Each grid comprises 2 sets of N electrodes arranged in a comb configuration from common electrodes. The two sets of electrodes are interdigitated to form an interdigital grid. The first array of interdigital grids are utilized to receive an alternating electrical input signal and generate a number of surface waves. The number of grids is determined by the number of channels desired in the preselector as well as by the desired bandwidths of each of the channels. The bandwidth, in part, is dependent upon the number of electrode pairs in each of the interdigital grids. The number of electrode pairs in each grid, on the other hand, is generally determined by conversion efficiencies. For example, in $LiNbO_3$, $N=10$ provides maximum conversion efficiency. For $10<N<17$, each electrode pair declines by about 2 dB.

Each of the interdigital grids of the first array is connected to a source of alternating electrical energy, such as an antenna, through a pair of bus lines. The common electrodes of each grid are connected to the bus lines so that all of the grids are connected in parallel. Each grid of the first array is designed to generate a surface wave of a selected frequency and bandwidth in response to a signal having the same frequency.

A second array of interdigital receiver grids is positioned opposite to the first array on the base. Each of the grids of the second array is adapted to receive generated surface waves of selected frequency and bandwidth. The number of grids in the second array is determined by the frequency and bandwidth of each of the desired channels. It is necessary, however, to position a receiving grid of the second array opposite to a transmitting grid of the first array from which the desired frequencies are transmitted.

Thus, an input signal having a broad band can be broken down into any number of narrower bands. Each transmitting grid is receptive to a specific bandwidth frequency of the input signal and in response to that signal generates a surface wave which is in whole or in part received by an oppositely positioned receiving grid. The signal received by a grid of the second array is then processed in any desired manner.

In an interdigital grid having electrodes of uniform length, the frequency response of each electrode is sin $x/x$. The bandwidth of each interdigital grid measured between the first zero points from the center frequency is equal to $f_o \pm f_o/N$ where N is the number of electrode pairs in each interdigital grid. In a preselector of the present invention, having preferably a number of channels, the fractional bandwidth varies from the lowest to the highest frequency necessitating a different N for each ID grid center frequency. Rather than varying the number of electrodes per interdigital grid to obtain absolute bandwidths, it is possible to maintain constant the fractional bandwidth. A fixed fractional bandwidth can be maintained for all channels by unevenly spacing the center frequencies of each of the channels. This requires overlapping, that is, the zero value of each channel coincides with the maxima of the adjacent channel in a multichannel preselector. Since the interdigital grids are fabricated from rubyliths for a photoresist mask, it is preferable to utilize a fixed fractional bandwidth because each grid is not required to be individually cut. In the fixed fractional bandwidth preselector, the apertures between electrodes are controlled rather than the number of electrodes. Therefore, the fixed fractional bandwidth grid arrangement is preferred.

Another means for increasing the bandwidth which is extremely efficient is to vary the spacing between successive pairs of electrodes. For example, the electrodes with the widest spacing respond to the lowest input frequency while those with the closest spacing respond to the highest frequency input. The receiver grid is positioned opposite the corresponding transmitter grid so that widest spaced electrodes are nearest the closest spaced electrodes of the transmitter grid or vice versa. Thus, the distance between corresponding pairs of electrodes in the receiver and transmitter grids is the same for all frequencies. The travel time from one grid to the other is the same for all frequencies which provides a nondispersive preselector device.

Other advantages of the invention will become apparent from a perusal of the following detailed description of presently preferred embodiments, taken in connection with the accompanying drawings.

PRESENTLY PREFERRED EMBODIMENTS

Figure 1:
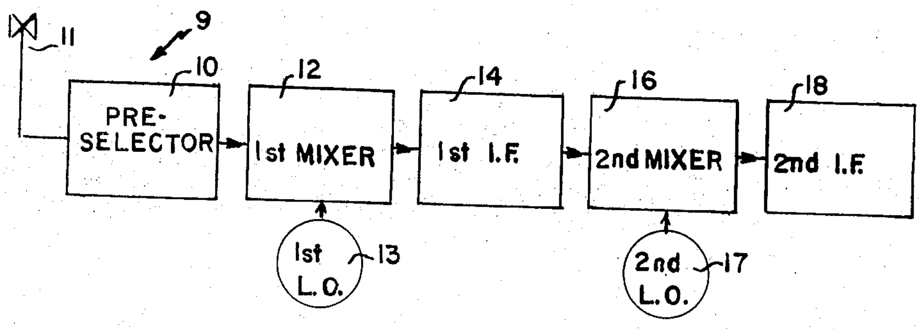
FIG. 1 is a block diagram showing a use of the preselector in a radio communication device.

The preselector shown in FIG. 1 is for use in a communications receiver operating in the 30 to 80 MHz band. The description of the preselector in a communications receiver of the specific frequency range is illustrative of one particular use. It is, however, understood that the surface wave preselector of the present invention is adaptable to any number of different frequency ranges, any number of desired channels as well as for use in different applications.

Communication receiver 9 of FIG. 1 includes a surface wave preselector 10 connected to a receiver antenna 11 and a first mixer 12 to which a first local oscillator 13 is connected. First mixer 12 is connected to first IF stage circuit 14, for example, 5 MHz. First IF stage circuit 14 is connected to a second mixer 16 which has connected thereto a second local oscillator 17. Second mixer 16 is connected to second IF stage circuit 18 of 25 KHz. In communication receiver 9, the minimum requirement for preselector 10 is rejection of the image frequency at first mixer 12. That is, the preselector band pass should be lses than twice the first immediate frequency, viz., less than 10 MHz.

Since the frequency response of an interdigital grid with electrodes of uniform length is sin $x/x$, the bandwidth of the first zero points from center frequency $f_o$ is $f_o \pm f_o/N$, where N is the number of electrode pairs in the interdigital grid. Thus, a preselector for use in communication receiver 9 as shown in FIG. 1 could be designed to have ten bands or channels each of which is ± 5 MHz wide. However, since the fractional bandwidth varies from the lowest to the highest frequency, a different number N of electrode pairs are needed for each interdigital receiver grid center frequency. Utilization of such a design necessitates individually cutting each grid for the photoresist mask. While this is a suitable method of making a useful preselector, it involves considerably more expense than the fixed fractional bandwidth method.

It is preferable to utilize transmitter and receiver grids in which a fixed fractional bandwidth is maintained for all channels, but in which the center frequencies of those channels are unevenly spaced. To maintain the required overlap, the zero values of each channel coincides with the maxima of the adjacent channels. Thus, referring to FIG. 2, preselector 10 utilizes fixed fractional bandwidths for each channel. It has been found that for lithium niobate the power gain for a $y$-cut $z$-propagation reaches a maximum for 10 electrode pairs and thereafter declines where N is greater than 10 but less than 17 by approximately 2 dB. Accordingly, preselector 10 in which a lithium niobate surface 20 is used, ten electrode pairs per interdigital grid achieve the maximum conversion efficiency. By the utilization of ten electrode pairs, the bandwidth of each of the ten channels would be ± 10 percent.

Figure 3:
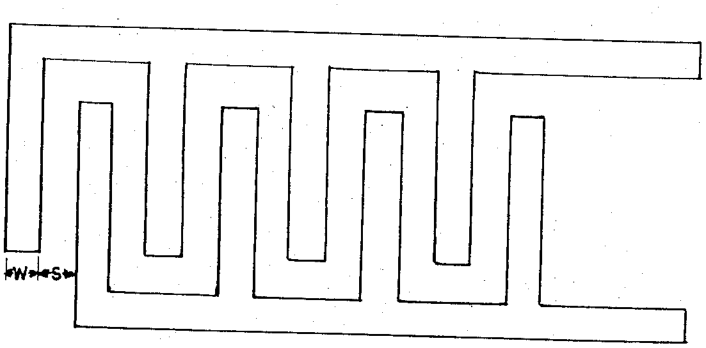
FIG. 3 is an enlarged view of the electrodes and spacing of an interdigital grid.

More particularly, preselector 10 includes a first array of interdigital electrode grids 21 deposited on piezoelectric base 20, preferably of $LiNbO_3$. First array 21 consists of five interdigital electrode grids 22–26 as shown in FIG. 3. Electrode grids 22–26 each include five pairs of interdigitated electrodes having common electrodes 22*a* and *b* ... 26*a* and *b*. First array 21 includes a pair of bus lines 28 and 29 to which antenna 11 leads are connected. Grids 22–26 are preferably positioned between bus lines 28 and 29 with the interdigital electrodes positioned substantially parallel thereto. Common electrodes 22*a*...26*a* are electrically connected to bus line 28 and electrodes 22*b*...26*b* are electrically connected to bus line 29.

Interdigital electrode grids 22–26 of the first array transmit or generate surface waves upon receiving a signal impressed on antenna 11. In a receiver 9 of FIG. 1, for example, designed for operation in the 30 to 80 MHz band, each grid has a 20 percent bandwidth. In Table I below, the center frequencies of each transmitting grid 22–26 is set forth together with the bandwidth and passband.

TABLE I

| I.D. Grid | $f_o$ MHz | BW ± MHz | Passband MHz |
|---|---|---|---|
| 22 | 32.5 | 6.5 | 26.0 – 39.0 |
| 23 | 41.0 | 8.2 | 32.8 – 49.2 |
| 24 | 50.5 | 10.1 | 40.4 – 60.6 |
| 25 | 62.0 | 12.4 | 49.6 – 74.4 |
| 26 | 76.0 | 15.2 | 60.8 – 91.2 |

Table II below sets forth the relevant dimensions for the interdigital transmitter grids 22–26. Referring to FIG. 3, an enlarged view of a portion of a grid showing two pairs of intedigitated electrodes, w represents the width of each electrode and s represents the space between adjacent interdigitated electrodes. In this embodiment $w=s$, and the aperture width between interdigital grids is fixed at 10λ.

TABLE II

Transmitter Grid Electrode Widths and Spacings

| Grid | $f_o$ MHz | λ × $10^{-4}$cm | w=s=λ/4 × $10^{-4}$cm |
|---|---|---|---|
| 22 | 32.5 | 104.5 | 26.13 |
| 23 | 41.0 | 83.0 | 20.75 |
| 24 | 50.5 | 67.4 | 16.85 |
| 25 | 62.0 | 55.0 | 13.75 |
| 26 | 76.0 | 44.7 | 11.15 |

A second array 31 of interdigital electrode grids, as shown in FIG. 3, is deposited on base 20. Second array 31 comprises ten interdigital receiver grids 32–41. Adjacent receiver grids are positioned on opposite sides of a corresponding transmitter grid. In this embodiment, the center frequency of each of the transmitter grids 22–26 is selected to be midway between the center frequencies of two adjacent receiver grids 32–41. This is done to maintain a constant or fixed fractional bandwidth. Table III discloses the center frequencies of each of the receiver grids 32–41.

TABLE III

Center Frequencies of Receiver Grids

| Grid No. | $f_o$ MHz | BW ± MHz | Passband MHz |
|---|---|---|---|
| 32 | 31 | 3.1 | 28–34 |
| 33 | 34 | 3.4 | 31–37 |
| 34 | 39 | 3.9 | 34–43 |
| 35 | 43 | 4.3 | 39–47 |
| 36 | 48 | 4.8 | 43–53 |
| 37 | 53 | 5.3 | 48–58 |
| 38 | 59 | 5.9 | 53–65 |
| 39 | 65 | 6.5 | 59–71.5 |
| 40 | 72 | 7.2 | 65–79 |
| 41 | 80 | 8 | 72–88 |

Table IV below, with reference to FIG. 3, sets forth the relevant receiver grid spacing and electrode widths.

TABLE IV

Receiver Grid Electrode Widths and Spacing*

| Grid No. | $f_o$ MHz | λ × $10^{-4}$cm | w=s=λ/4 × $10^{-4}$cm |
|---|---|---|---|
| 32 | 31 | 110.0 | 27.40 |
| 33 | 34 | 100.0 | 25.00 |
| 34 | 39 | 87.0 | 21.80 |
| 35 | 43 | 79.0 | 19.75 |
| 36 | 48 | 71.9 | 17.75 |
| 37 | 53 | 64.1 | 16.00 |
| 38 | 59 | 57.6 | 14.40 |
| 39 | 65 | 52.3 | 13.05 |
| 40 | 72 | 47.2 | 11.80 |
| 41 | 80 | 42.5 | 10.60 |

* Using the measured surface velocity value of $v_o = 3.4 \times 10^5$cm sec $^{-1}$.

Each interdigital grid 32–41 of second array 31 includes a pair of common electrodes 32*a* and *b* ... 41*a* and b to which output leads 42–51 respectively are connected for connection with a further signal processing device (not shown).

By utilizing the preferred embodiment, only two rubyliths are required, one for the transmitter grids and one for the receiver grids, which are reduced by varying amounts from between 4 and 12 to prepare 15 different reduced "rubylith" grids. The reductions are made as set forth in Tables V and VI below, and then further reduced 100 times to prepare the required photoresist mask. Tables V and VI show the transmitter and receiver grid dimensions and the reduction factors from the two original rubyliths for the intermediate rubylith which is reduced 100 times.

TABLE V

Transmitter Grid Spacings, Lengths, and Reduction Factors

| $f_o$ MHz | w=s=λ/4 × $10^{-4}$cm | Reduction factor | Grid length after reduction, cm |
|---|---|---|---|
| 32.5 | 26.10 | 4.85 | 4.97 |
| 41.0 | 20.70 | 6.12 | 3.93 |
| 50.5 | 16.85 | 7.52 | 3.20 |
| 60.0 | 13.75 | 9.25 | 2.61 |
| 76.0 | 11.15 | 11.35 | 2.12 |

TABLE VI

Receiver Grid Spacings, Lengths, and Reduction Factors

| $f_o$ MHz | w=s=λ/4 × $10^{-4}$cm | Reduction factor | Grid length after reduction, cm |
|---|---|---|---|
| 31 | 27.40 | 4.63 | 10.70 |
| 34 | 25.00 | 5.00 | 9.70 |
| 39 | 21.80 | 5.87 | 8.52 |
| 43 | 19.75 | 6.40 | 7.72 |
| 48 | 17.75 | 7.15 | 6.94 |
| 53 | 16.00 | 7.90 | 6.25 |
| 59 | 14.40 | 8.75 | 5.65 |
| 65 | 13.05 | 9.72 | 5.10 |
| 72 | 11.80 | 10.75 | 4.60 |
| 80 | 10.60 | 12.00 | 4.14 |

After reduction, the master negative mask is used to produce a submaster positive mask by contact printing.

Figure 4:
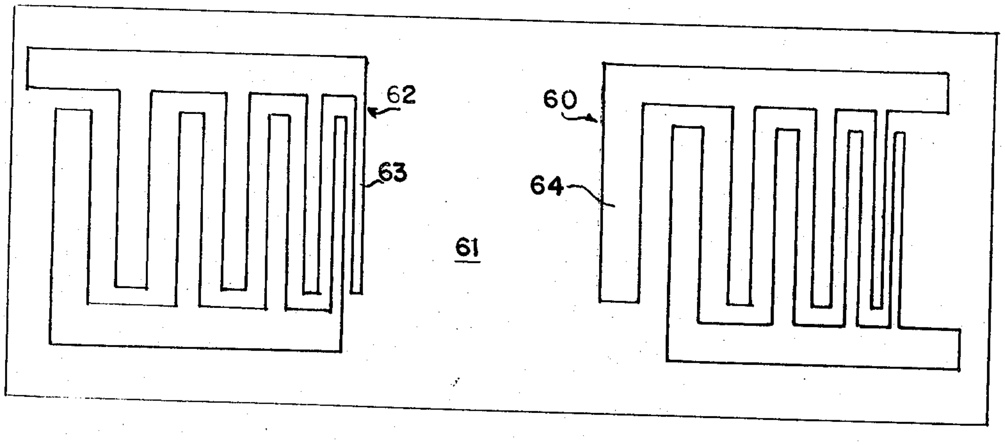
FIG. 4 is an enlarged view of a transmitter and receiver grid having electrodes with varying spacing therebetween.

In another embodiment, the bandwidth can be efficiently increased by varying the spacing between successive pairs of electrodes. In FIG. 4, a transmitter grid 60 is positioned on a substrate 61 with a corresponding receiver grid 62 positioned opposite thereto. The spacing between and the widths of the electrodes for a square passband are determined in accordance with the following formula:

$$w_m = v/4\ (1/f_1 + (m-1)\delta f)$$

where $w_m$ = the width of an electrode or space;
$v$ = surface wave velocity;
$\delta f = \Delta f/3N$;
$\Delta f$ = bandwidth;
$f_1$ = lowest frequency of the band;
$m$ = 1,3,5...3N for electrodes
$m$ = 2,4,6...($3N$–1) for spaces, and
$N$ = total number of electrode pairs.

Figure 2:
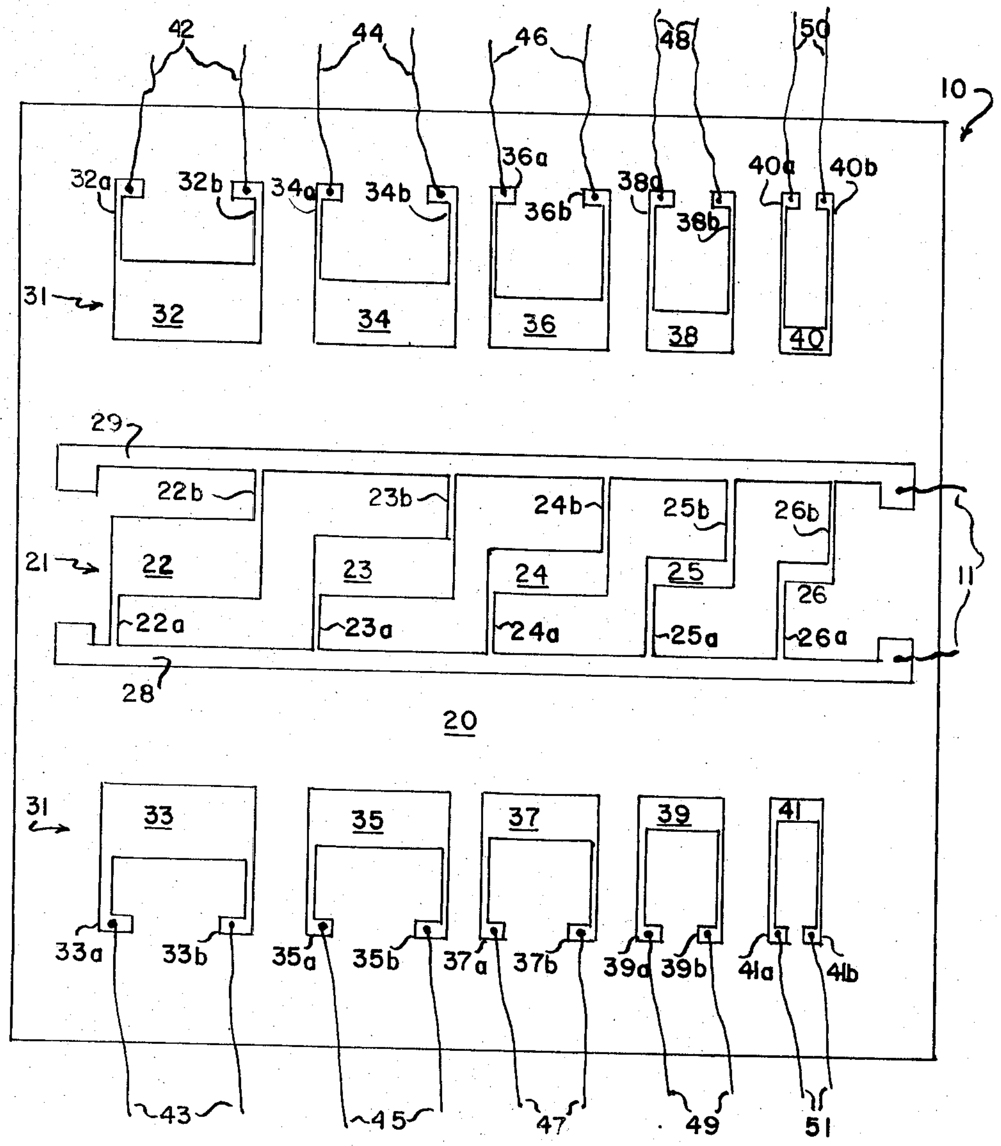
FIG. 2 is a plan view of a ten channel preselector according to the present invention.

The highest frequency electrode 63 of receiver grid 62 is positioned opposite to lowest frequency electrode 64 of transmitter grid 60. Alternatively, the lowest frequency electrode of the receiver could be positioned opposite to the highest frequency transmitter electrode which would be the case in an arrangement such as shown in FIG. 2 where two rows of receiver grids are used. Thus, the distance between corresponding electrodes in grids 60 and 62 is the same for all frequencies and the travel time from one grid to the other is the same for all frequencies.

While presently preferred embodiments have been shown and described in detail, the invention may otherwise be embodied within the scope of the appended claims.

What is claimed is:

1. A surface wave preselector comprising:

a. piezoelectric base;

b. a plurality of interdigital transmitter grids deposited on said base, each of said grids adapted to receive an input signal and generate a surface wave in response to a selected frequency of said input signal;

c. a plurality of interdigital receiver grids deposited on said base, each of said grids being adapted to receive a surface wave of selected frequency transmitted in said base by a transmitter grid and produce an output signal in response thereto, each of said receiver grids being positioned opposite from an associated transmitter grid, and wherein said transmitter and receiver grids each includes a plurality of electrodes having widths and spaces therebetween in accordance with the following general formula $$w_m = v/4\ (1/f_1 + (m-1)\ \delta f),$$

where $w_m$ = the electrode width or space;

$\delta f = \Delta f/3N$;

$\Delta f$ = the bandwidth;

$f_1$ = the lowest band frequency;

$m$ = 1,3,5...3N for the electrode widths;

$m$ = 2,4,6...($3N-1$) for the spaces between electrodes; and $N$ = total electrode pairs.

2. A surface wave preselector comprising:

a. a piezoelectric base member;

b. a first array of interdigital transmitter grids deposited on said base, each of said grids being connected to an input signal and having a plurality of parallel electrodes adapted to generate surface waves in said base of a selected frequency and bandwidth in response to an input signal having said frequencies; and c. a second array of interdigital receiver grids deposited on said base, the number of said receiver grids being greater than the number of transmitter grids, each of said receiver grids including a plurality of parallel electrodes adapted to receive a surface wave of selected frequency and bandwidth and produce an output signal, at least one of said receiver grids being adapted to receive a surface wave of a frequency associated with at least one of said transmitter grids and having a bandwidth less than said associated transmitter grid, said associated grids of said first and second arrays being opposingly positioned on said base, said electrodes of each of said transmitter and receiver grids having widths and spaces therebetween in accordance with the following general formula:

$$w_m = v/4\ (1/f_1 + (m-1)\ \delta f),$$

where $w_m$ = the electrode width or space;

$\delta f = \Delta f/3N$;

$\Delta f$ = the bandwidth;

$f_1$ = the lowest band frequency;

$m$ = 1,3,5...3N for the electrode widths;

$m$ = 2,4,6...($3N-1$) for the spaces between electrodes; and $N$ = total electrode pairs.

3. A surface wave preselector as set forth in claim 2 wherein said second array includes a first and second set of receiver grids, each of said first and second sets comprising the same number of receiver grids as transmitter grids, said receiver grids of said first and second sets being positioned on opposite sides of frequency associated transmitter grids.

4. A surface wave preselector as set forth in claim 3 wherein the center frequency of each of said transmitter grids is selected to be midway between the center frequencies of said associated receiver grids positioned on opposite sides thereof.

* * * * *